(12) United States Patent
Peng et al.

(10) Patent No.: US 7,808,801 B2
(45) Date of Patent: Oct. 5, 2010

(54) MOUNTING APPARATUS FOR EXPANSION CARD

(75) Inventors: Wen-Tang Peng, Taipei Hsien (TW); Jun-Xiong Zhang, Shenzhen (CN); Xin-Hu Gong, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 736 days.

(21) Appl. No.: 11/759,237

(22) Filed: Jun. 7, 2007

(65) Prior Publication Data

US 2008/0000850 A1  Jan. 3, 2008

(30) Foreign Application Priority Data

Jun. 28, 2006  (CN)  .......................  2006 1 0061371

(51) Int. Cl.
 *H05K 7/12*  (2006.01)
(52) U.S. Cl.  ....................  361/801; 361/759; 361/747
(58) Field of Classification Search  ................  361/801, 361/759, 747, 726, 740
 See application file for complete search history.

(56) References Cited

U.S. PATENT DOCUMENTS

| | | | |
|---|---|---|---|
| 6,442,038 B1 * | 8/2002 | Erickson et al. | ............. 361/759 |
| 6,634,898 B2 | 10/2003 | Clements | |
| 6,704,205 B1 * | 3/2004 | Chen | ........................... 361/740 |
| 6,834,766 B2 * | 12/2004 | Lin et al. | .................. 211/41.17 |
| 6,960,720 B2 * | 11/2005 | Wen-Lung | .................... 174/50 |
| 7,050,296 B2 * | 5/2006 | Liao | ....................... 361/679.33 |
| 7,054,164 B2 * | 5/2006 | Shih-Tsung | ................. 361/801 |
| 7,203,076 B1 * | 4/2007 | Liang | .......................... 361/801 |
| 7,254,041 B2 * | 8/2007 | Chen et al. | ................... 361/801 |
| 7,561,440 B2 * | 7/2009 | Dai | ............................. 361/801 |

FOREIGN PATENT DOCUMENTS

| | | |
|---|---|---|
| CN | 2587008 Y | 11/2003 |
| CN | 2813806 Y | 4/2004 |
| TW | 578955 | 3/2004 |
| TW | M284022 U | 12/2005 |
| TW | M293467 U | 7/2006 |

\* cited by examiner

*Primary Examiner*—Dameon E Levi
(74) *Attorney, Agent, or Firm*—Frank R. Niranjan

(57) ABSTRACT

A mounting apparatus is provided for mounting expansion cards. The mounting apparatus includes a rear panel, a retainer, and a clip. The rear panel has a support wall for supporting the bent portion of the cover plate, the rear panel defining an opening for facilitating installing or removing the expansion card. The retainer has a pressing plate pivotally coupled to the support wall. The clip has a resilient member for securing the retainer to the rear panel. The retainer has a fixing member for clasping the bent portion of the cover plate when the retainer is rotated to a first position and unclasping the bent portion of the cover plate if the retainer is rotated to a second position.

17 Claims, 4 Drawing Sheets

MOUNTING APPARATUS FOR EXPANSION CARD

BACKGROUND OF THE INVENTION

1. Field of the Invention

The present invention generally relates to mounting apparatuses. More particularly, the invention relates to a mounting apparatus for mounting expansion cards to a computer enclosure.

2. Description of Related Art

Modern computer systems such as servers, workstations, and personal computers, include expansion cards electrically connected to a motherboard or a circuit board to enhance the capacity or functionality of the computer.

An expansion card generally has a cover plate along one edge. The cover plate has an outward-extending tab. When the expansion card is plugged to a connector in a computer enclosure, the cover plate is inserted into a card slot defined in a rear panel of the computer enclosure. Screws are used to secure the tab to a support wall on the rear panel by a screwdriver. The screwdriver is also used to disassemble the screws when removing the expansion card. It is inconvenient and time-consuming to install and remove the expansion card with the screwdriver. Furthermore, the screws are so small and easily dropped into the computer enclosure.

SUMMARY OF THE INVENTION

Accordingly, a mounting apparatus is provided for mounting an expansion card. The mounting apparatus includes a rear panel having a support wall for supporting a bent portion of the expansion card, the rear panel defining an opening adjacent to the support wall, the support wall comprising a hinged member, the hinged member extending in a direction away from the opening, a retainer comprising a fixing member and a pressing plate, the pressing plate comprising a bent engaging portion corresponding to the hinged member, the pressing plate pivotally mounted to the support wall by pivotally coupling the bent engaging portion to the hinged member, the retainer being rotatable between a locked position where the retainer shields the opening and the bent portion of the expansion card is sandwiched between the fixing member and the support wall and an unlocked position where the retainer is rotated away from the opening and the fixing member releases the bent portion of the expansion card, a clip attached to the retainer, the clip having a resilient member configured for extending through the opening and resiliently catching a portion of the rear panel adjacent to the opening to hold the retainer at the locked position.

Other systems, methods, features, and advantages of the present mounting apparatus will be or become apparent to one with skill in the art upon examination of the following drawings and detailed description. It is intended that all such additional systems, methods, features, and advantages be included within this description, be within the scope of the present apparatus, and be protected by the accompanying claims.

BRIEF DESCRIPTION OF THE DRAWINGS

Many aspects of the present mounting apparatus can be better understood with reference to the following drawings. The components in the drawings are not necessarily drawn to scale, emphasis instead being placed upon clearly illustrating the principles of the present device. Moreover, in the drawings, like reference numerals designate corresponding parts throughout the several views.

DETAILED DESCRIPTION OF THE INVENTION

Reference will now be made in detail to the embodiments of the present mounting apparatus, examples of which are illustrated in the accompanying drawings.

Figure 1:
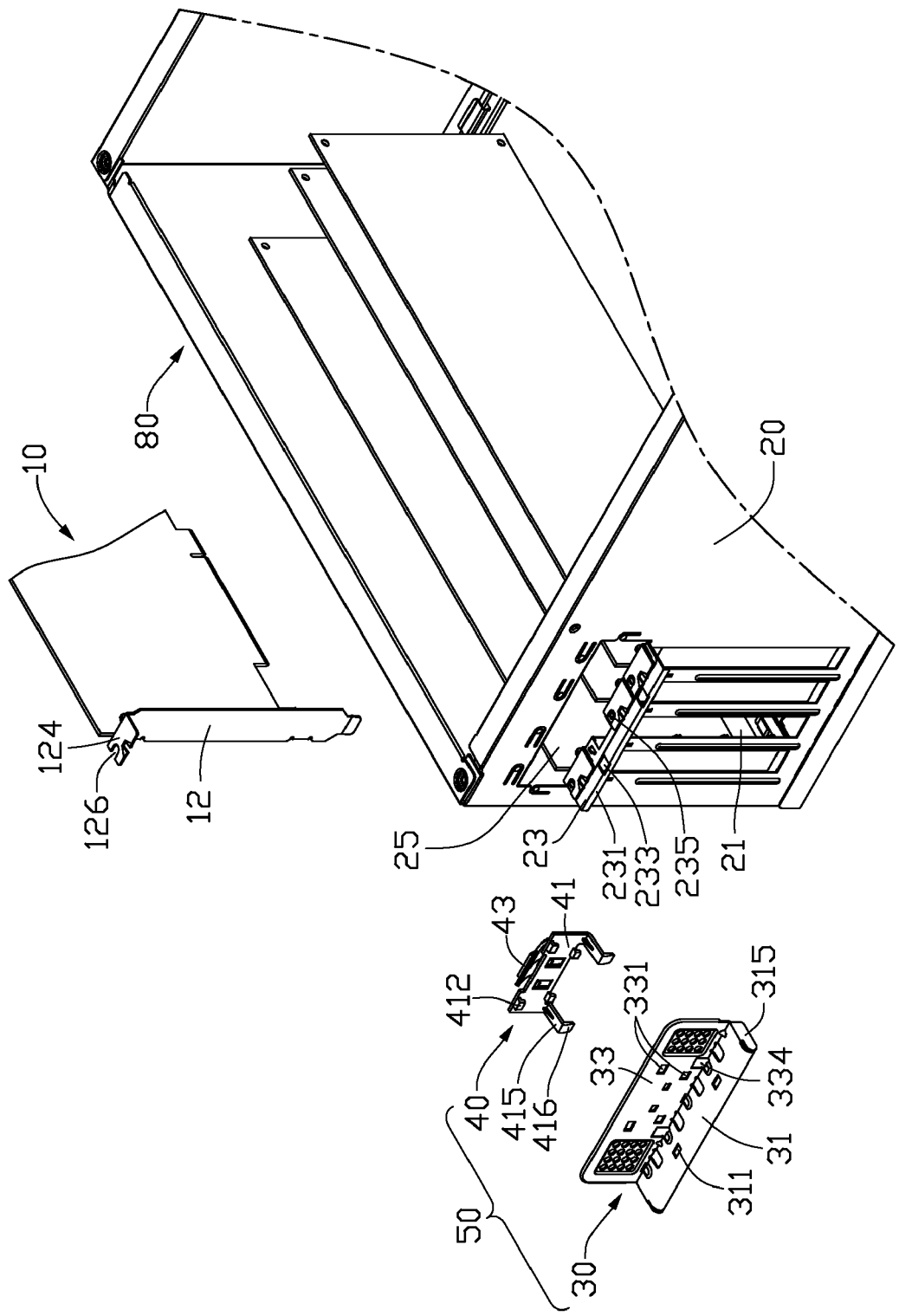
FIG. 1 is an exploded, isometric view of a mounting apparatus in accordance with an exemplary embodiment, the mounting apparatus including a retainer and a clip.

Referring to FIG. 1, an expansion card 10 is formed with a cover plate 12 on a lateral edge (not labeled) thereof. The cover plate 12 has a bent portion such as a tab 124 at one end thereof. A notch 126 is defined in the tab 124.

A computer enclosure 80 has a rear panel 20. A plurality of elongated card slots 21 is defined in the rear panel 20. The card slots 21 are parallel with each other. A support wall 23 substantially perpendicularly extends outward from the rear panel 20, adjacent to the card slots 21. A generally rectangular opening 25 is defined in the rear panel 20, adjacent to the support wall 23. The opening 25 is used for facilitating installation and removal of the expansion card 10. That is, when the expansion card 10 is plugged into a connector (not labeled) in the computer enclosure 80, the tab 124 of the expansion card 10 extends through the opening 25 and contacts the support wall 23. An inclined wall such as a stop portion 27 (shown in FIG. 4) projects from one portion of the rear panel 20 adjacent the opening 25 toward an interior of the computer enclosure 80.

An outer edge of the support wall 23 is bent downward to form a hinged member 231 extending in a direction away from the opening 25. In a vicinity of the hinged member 231, two receiving holes 233 are defined in the support wall 23. A plurality of positioning posts 235 protrude upward from the support wall 23 at equal intervals.

A mounting apparatus 50 includes a retainer 30 and a clip 40 attached to the retainer 30. The retainer 30 is made of steel material, and the clip 40 is made of plastic material. The retainer 30 and the clip 40 form a rotatable assembly or pivotal member for fastening the expansion card 10 to the rear panel 20.

Figure 2:
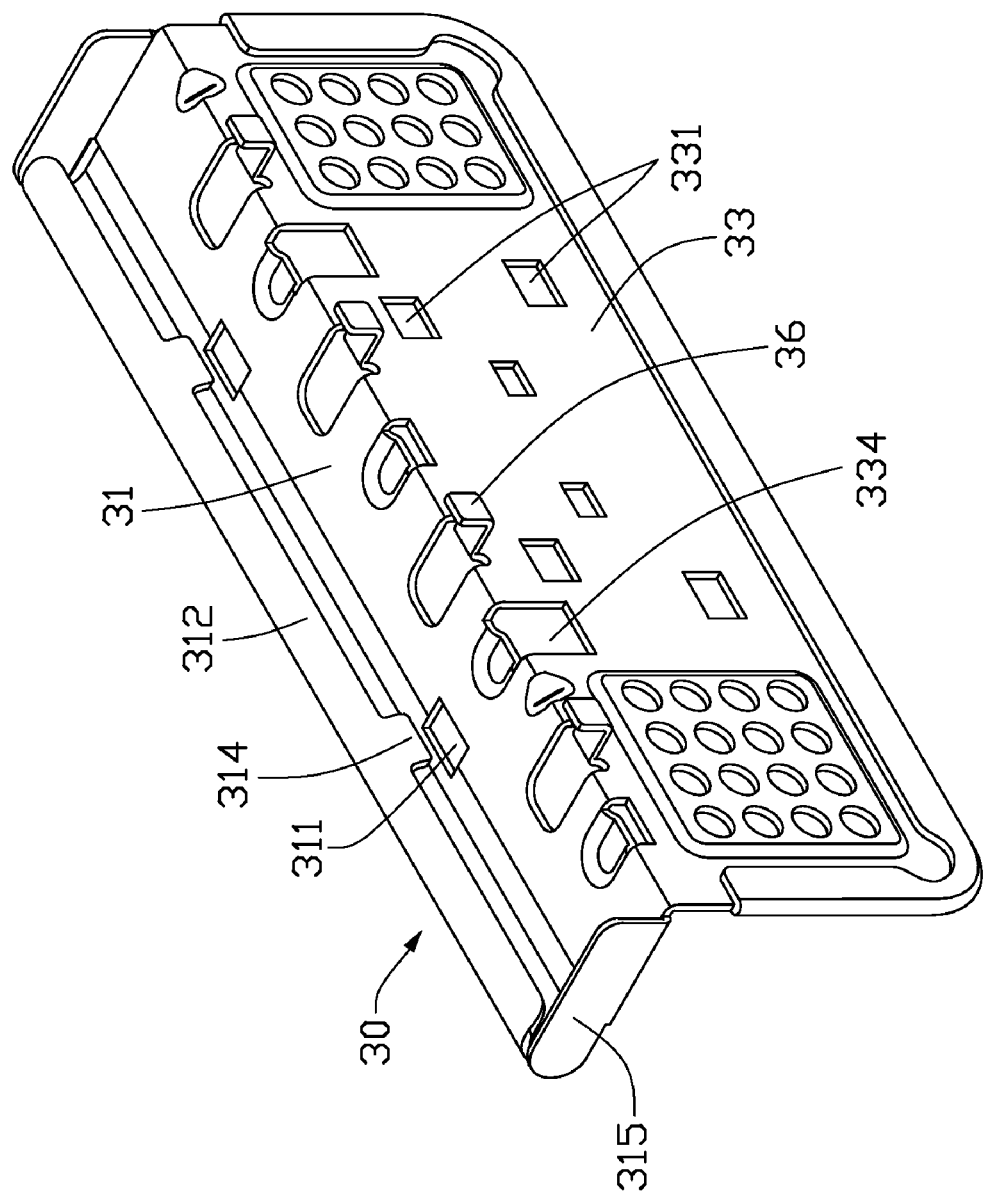
FIG. 2 is an enlarged view of the retainer in FIG. 1, but viewed from another aspect.

The retainer 30 includes an pressing plate 31 and a blocking plate 33 that are substantially perpendicular to each other. The pressing plate 31 includes an engaging portion such as a curved piece 312 and two spacing plates 315. The two spacing plates 315 are respectively formed at opposite lateral sides of the pressing plate 31 and substantially perpendicular to the pressing plate 31. Two through holes 311 are defined in the pressing plate 31 corresponding to the receiving holes 233 in the support wall 23. The curved piece 312 is bent from a free edge of the pressing plate 31 between the spacing plates 315, defining a space between the curved piece 312 and the pressing plate 31 for accommodating the hinged member 231 formed on the support wall 23. Referring to FIG. 2, two locking tabs 314 is projected from the curved piece 312 in an approximately same direction that the curved piece 312 is bent toward the pressing plate 31.

The blocking plate 33 is substantially rectangular with a size to properly close off the opening 25. Two coupling holes 331 and two cutouts 334 are defined in the blocking plate 33. The cutouts 334 are defined adjacent to the pressing plate 31. Fixing members such as a plurality of clasps 36 with L-shaped free ends are formed on the blocking plate 33 corresponding to the tab 124 of the expansion card 10. Preferably, the clasps 36 are bent from the pressing plate 31 with their free ends extending in the same direction along which the spacing plates 315 extend, leaving cutouts (not labeled) in the pressing plate 31.

The clip 40 includes a base plate 41 and a resilient member such as a V-shaped resilient catch 43 formed on the base plate 41. Opposite to the side on which the catch 43 is formed, a pair of inverted L-shaped hooks 412 projects from the base plate 41 corresponding to the coupling holes 331 of the retainer 30.

Figure 3:
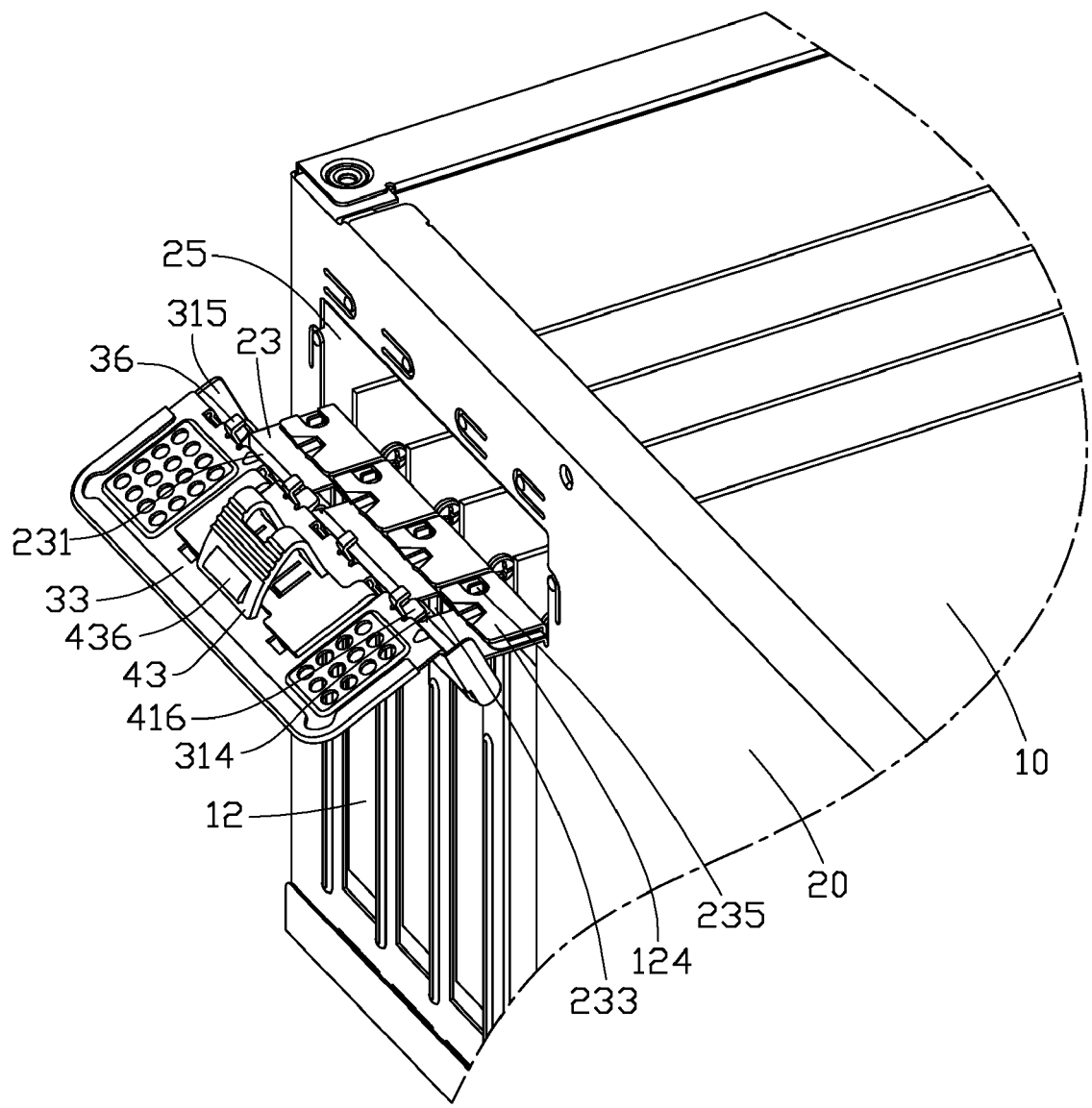
FIG. 3 and FIG. 4 are assembled views of FIG. 1, respectively showing an unlocked state and a locked state of the mounting apparatus.

As illustrated in FIG. 3, the catch 43 is bent from the base plate 41 with an operating member 436 formed at its free end (not labeled). By depressing the operating member 436, the catch 43 can be resiliently deformed.

At one end of the base plate 41, a pair of extension bars 415 perpendicularly extends out corresponding to the cutouts 334 of the blocking plate 33. Two fingers 416 are formed at two ends of the extension bars 415 respectively corresponding to the locking tabs 314 of the curved piece 312.

Referring generally to FIGS. 1-3, the expansion card 10 has been inserted into a connector (not labeled) of a motherboard (not labeled) or a circuit board (not labeled) accommodated in the computer enclosure 80. The cover plate 12 of the expansion card 10 is inserted into one of the card slots 21 in the rear panel 20. The notch 126 of the tab 124 receives the positioning post 235.

In order to securely fix the expansion card 10 in the computer enclosure 80, a rotatable assembly formed by the retainer 30 and the clip 40 is used. The retainer 30 is pivotally mounted to the support wall 23 by pivotally receiving the hinged member 231 of the support wall 23 in the space formed between the curved piece 312 and the pressing plate 31 of the retainer 30. The spacing plates 315 of the pressing plate 31 contact opposite ends of the hinged member 231, so as to restrict a lateral movement of the retainer 30 parallel to the rear panel 20. The locking tabs 314 of the curved piece 312 are received in the receiving holes 233 of the support wall 23.

The extension bars 415 of the clip 40 pass through the cutouts 334 of the retainer 30. The hooks 412 are inserted into the coupling holes 331 of the blocking plate 33, thereby, the clip 40 is attached to the retainer 30 to form a rotatable assembly. The fingers 416 of the clip 40 respectively extend through the through holes 311 to tightly abut against the locking tabs 314 such that the retainer 30 can rotate around the hinged member 231 without escaping from the support wall 23.

Figure 4:
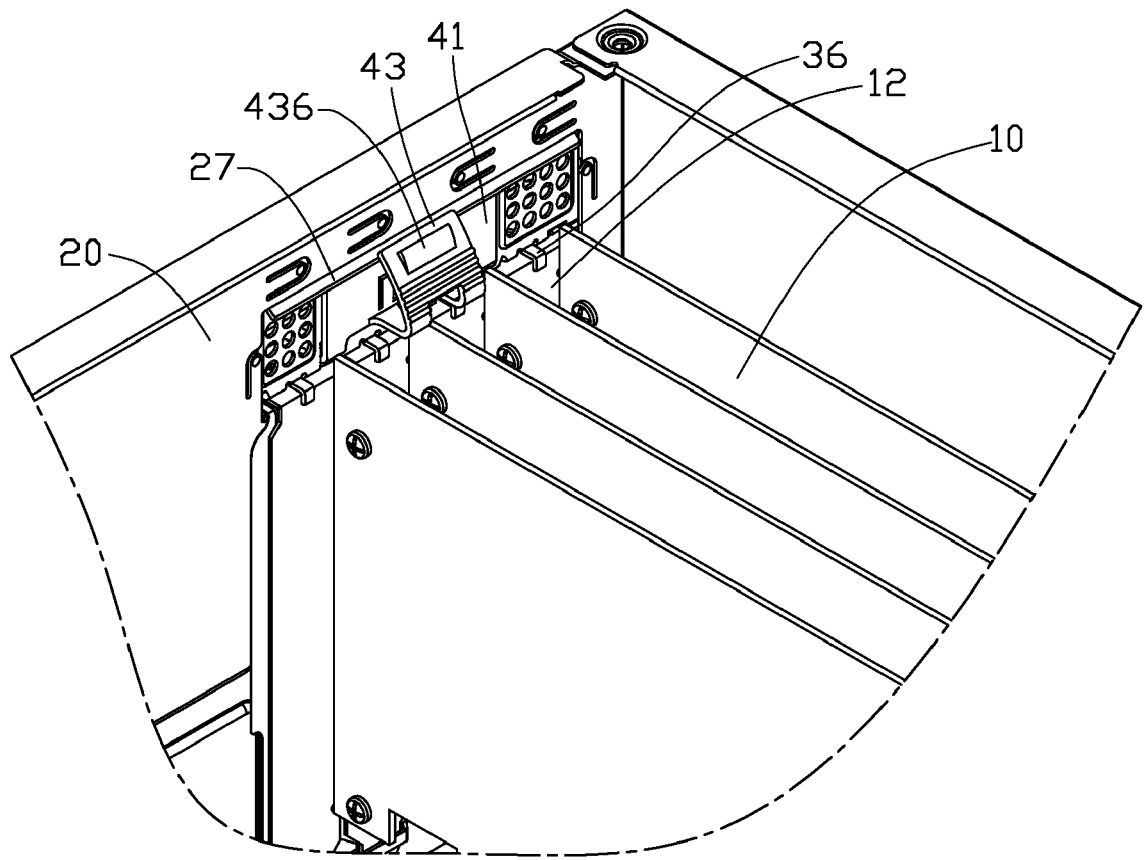

Referring to FIG. 4, after the expansion cards 10 are inserted in the corresponding connectors within the computer enclosure 80, the rotating assembly is rotated until the free end of the catch 43 contacts with the stop portion 27 of the rear panel 20. The catch 43 is resiliently deformed by pushing the block plate 33 toward the interior of the enclosure, and the free end (not labeled) of the catch 43 presses against the stop portion 27 of the rear panel 20 after releasing the block plate 33. Thereby, the blocking plate 33 shields the opening 25 of the rear panel 20, and the pressing plate 31 downward presses against the tabs 124 of the expansion cards 10 and the L-shaped clasps 36 press against conjunction areas between the tabs 124 and the cover plates 12 of the expansion cards 10. Thus, the expansion cards 10 are firmly mounted.

When viewing the mounting apparatus with expansion card 10 mounted therein, in a three-dimensional space, it can be seen that the positioning posts 235 of the support wall 23 received in the notches 126 of the tabs 124 prevent movement of the expansion cards 10 in a first direction perpendicular to the expansion cards 10. The clasps 36 of the retainer 30 prevent a second direction movement of the expansion card 10 perpendicular to the rear panel 20 by pressing conjunction areas between the tabs 124 and the cover plates 12 of the expansion cards 10. The pressing plate 31 downward pressing against the tabs 124 of the expansion cards 10 can prevent movement of the expansion cards 10 in a third direction parallel to the rear panel 20. Since the catch 43 exerts a resilient force against the rear panel 20, the clasps 36 cannot move. Therefore, the expansion card 10 is fixedly mounted to the enclosure of the computer.

When disassembling the expansion card 10, the operating member 436 is depressed and the catch 43 is resiliently deformed to facilitate decoupling the catch 43 from the stop portion 27. The retainer 30 is rotated out away from the opening 25 by pulling the blocking plate 33. Consequently, the pressing plate 31 and the clasps 36 release the tabs 124. After that, the expansion card 10 can be easily taken out of the computer enclosure 80.

As the above-mentioned embodiments disclosed, the whole assembly and disassembly process is simple and convenient, without using tool-based mounting mechanisms, such as screws and screwdrivers. During the assembly process, by rotating the retainer 30 and pressing the blocking plate 33 of the retainer 30 toward the opening 25, the expansion card 10 can be fixed in position. To remove the expansion card 10, simply depress the operation member 436 of the catch 43, rotate the retainer 30 away from the rear panel 20, and take out the expansion card 10 from the computer.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A mounting apparatus for mounting an expansion card with a bent portion to a computer enclosure, comprising:

a rear panel comprising a support wall for supporting the bent portion of the expansion card, the rear panel defining an opening adjacent to the support wall, the support wall comprising a hinged member, the hinged member extending in a direction away from the opening;

a retainer comprising a fixing member and a pressing plate, the pressing plate comprising a bent engaging portion corresponding to the hinged member, the pressing plate pivotally mounted to the support wall by pivotally coupling the bent engaging portion to the hinged member, the retainer being rotatable between a locked position where the retainer shields the opening and the bent portion of the expansion card is sandwiched between the fixing member and the support wall and an unlocked position where the retainer is rotated away from the opening and the fixing member releases the bent portion of the expansion card; and a clip attached to the retainer, the clip having a resilient member configured for extending through the opening and resiliently catching a portion of the rear panel adjacent to the opening to hold the retainer at the locked position,
wherein the support wall defines two receiving holes adjacent to the hinged member, the bent engaging portion is bent around a longitudinal side of the pressing plate, the bent engaging portion has two locking tabs formed thereon, and the locking tabs are engaged in the receiving holes when the bent engaging portion of the pressing plate is coupled to the hinged member of the supporting wall.

2. The mounting apparatus as claimed in claim 1, wherein the rear panel comprises a stop portion obliquely extending toward an interior of the computer enclosure, and the resilient member exerts a resilient force against the stop portion of the rear panel to provide a tight contact therebetween for restraining the retainer from being rotated away from the support wall.

3. The mounting apparatus as claimed in claim 1, wherein the retainer comprises a blocking plate extending substantially perpendicularly from the pressing plate configured for shielding the opening defined in the rear panel at the locked position.

4. The mounting apparatus as claimed in claim 1, wherein the pressing plate comprises two spacing plates extending from two opposite lateral sides thereof for sandwiching the hinged member therebetween to retain the articulating plate in the support wall.

5. The mounting apparatus as claimed in claim 3, wherein the clip comprises a base plate which comprises a pair of hooks formed on a side opposite to the resilient member, the blocking plate defining a pair of coupling holes corresponding to the hooks of the base plate, the clip is attached to the retainer by engagably coupling the hooks within the coupling holes.

6. The mounting apparatus as claimed in claim 5, wherein the base plate is formed with two extension bars each comprising a finger formed at a distal end thereof, the pressing plate is defined with two through holes adjacent to the bent engaging portion, when the retainer is mounted to the supporting wall, the extension bars are passed through the through holes defined in the pressing plate with the fingers abutting against the locking tabs of the bent engaging portion.

7. The mounting apparatus as claimed in claim 5, wherein the resilient member comprises an operating member adjacent to its free end, the resilient member is deformable to disengage from the portion of the rear panel by depressing the operating member, such that the retainer is rotatable from the locked position to the unlocked position to release the fixing member from the bent portion of the expansion card.

8. A mounting apparatus for mounting expansion cards, each of the expansion cards comprising a slot cover with a bent tab, the bent tab with a notch defined therein, the mounting apparatus comprising:
a rear panel defining a plurality of elongated card slots for receiving the slot covers, comprising a support wall for supporting the bent tabs of the expansion cards, a plurality of positioning posts protruded from the support wall, the positioning posts configured for being received in the notches of the tab of the expansion cards for restraining a first direction movement of the expansion cards; and
a rotatable assembly pivotally mounted to the support wall, the rotatable assembly comprising fixing members and a resilient member, the fixing members being configured for pressing the bent tabs of the expansion cards on the support wall for restraining a second direction movement of the expansion cards, and the resilient member resiliently abutting an inner side of the rear panel for preventing the rotatable assembly from being rotated away from the support wall,
wherein the rear panel is formed with an inclined wall thereof, the inclined wall is slanted toward an interior of the computer enclosure, the resilient member exerts a resilient force against the inclined wall for maintaining the fixing members pressing against the tabs of the expansion cards.

9. The mounting apparatus as claimed in claim 8, wherein the rotatable assembly comprise a retainer on which the fixing members are formed and a clip attached to the retainer by a clasping mechanism, the resilient member being formed on the clip.

10. The mounting apparatus as claimed in claim 9, wherein the retainer comprises a bent engaging portion, the support wall comprises a hinged member, and the bent engaging portion is pivotally mounted to the hinged member to enable the rotatable assembly to rotate around the support wall.

11. The mounting apparatus as claimed in claim 9, wherein the resilient member is formed on one side of the clip, the resilient member comprises an operating member formed adjacent to its free end, when the operating member is depressed, the resilient member is resiliently deformed to disengage from the inner side of the rear panel, such that the rotatable assembly is rotatable away from the support wall.

12. The mounting apparatus as claimed in claim 9, wherein the bent engaging portion has locking tabs formed thereon, the support wall is defined with two receiving holes adjacent to the hinged member, the locking tabs are inserted in the receiving holes.

13. The mounting apparatus as claimed in claim 12, wherein the clip has two extension bars with two fingers formed at their distal ends for abutting against the locking tabs of the bent engaging portion.

14. A computer system comprising:
a computer enclosure comprising a rear panel defining an opening, and at least one slot; a support wall perpendicularly extending out from one side of the opening of the rear panel;
at least one expansion card installed within an interior of the computer enclosure, the expansion card comprising a slot cover covering the at least one slot, a bent portion bent from a free end of the slot cover and seated on the support wall;
a pivotal member pivotably attached to an edge of the support wall away from the opening and parallel to the rear panel, the pivotal member comprising a pressing plate and a blocking plate extending from the pressing plate, the pivotal member being pivotable relative to the rear panel between a locked position where the pressing plate presses the bent portion of the slot cover against the support wall and the blocking plate shields the opening and an unlocked position where the blocking plate is removed from the opening and the pressing plate is rotated away from the bent portion of the slot cover such that the expansion card is removable from the computer enclosure, and
a clip fixed with the pivotal member, the clip comprising a resilient catch extending through the opening and abutting against an inner side of the rear panel for retaining the pivotal member at the locked position, wherein
when the resilient catch is depressed to deform and disengage from the inner side of the rear panel the pivotal member is pivotable from the locked position to the unlocked position.

15. The computer system as claimed in claim 14, wherein the catch has a V-shaped configuration with one fixed end fixed with the clip and a free end abutting against an inner side of the rear panel adjacent the opening.

16. The computer system as claimed in claim 14, wherein the pivotal member comprises at least a clasp extending from a conjunction portion between the pressing plate and the blocking plate, the clasp having an L-shaped free end configured for pressing a joint portion of the bent portion and the slot cover in a first direction parallel to the rear panel and a second direction perpendicular to the rear panel.

17. The computer system as claimed in claim 14, wherein the support wall comprises a hinged member extending in a direction toward the slot from the edge of the support wall away from the opening and parallel to the rear panel, a free edge of the pivotal member parallel to the rear panel is bent to form a curved piece with an accommodation space between the curved piece and the pivotal member, and the hinged member is received in the accommodation space in such a manner that the pivotal member is pivotably attached to the support wall.

* * * * *